United States Patent

Shimizu et al.

[11] Patent Number: 5,548,130
[45] Date of Patent: Aug. 20, 1996

[54] DC SUPERCONDUCTING QUANTUM INTERFERENCE DEVICE WITH SHIELD LAYER

[75] Inventors: Nobuhiro Shimizu; Norio Chiba; Satoru Yabe, all of Tokyo, Japan

[73] Assignee: Seiko Instruments Inc., Japan

[21] Appl. No.: 366,363

[22] Filed: Dec. 29, 1994

Related U.S. Application Data

[63] Continuation of Ser. No. 101,192, Aug. 3, 1993, abandoned.

[30] Foreign Application Priority Data

Aug. 11, 1992 [JP] Japan ..................... 4-214246

[51] Int. Cl.$^6$ .......................... G01R 33/035; H01L 29/06
[52] U.S. Cl. ............... 257/31; 257/36; 505/846; 505/874; 505/162; 324/248
[58] Field of Search .................. 257/31, 32, 34, 257/35, 663, 1, 36; 505/702, 874, 873, 190–193, 237, 239, 162, 846; 427/62, 63; 324/248

[56] References Cited

U.S. PATENT DOCUMENTS

| 4,761,611 | 8/1988 | Hoenig | 307/306 |
| 4,801,882 | 1/1989 | Daalmans | 257/31 |
| 5,218,297 | 6/1993 | Nakane et al. | 505/702 |

FOREIGN PATENT DOCUMENTS

| 0063887 | 11/1982 | European Pat. Off. . |
| 0501220 | 9/1992 | European Pat. Off. . |
| 61-196587 | 8/1986 | Japan | 257/34 |
| 01217981 | 8/1989 | Japan | 257/34 |
| 04130676 | 5/1992 | Japan | 257/34 |

OTHER PUBLICATIONS

Fujitsu Scientific and Technical Journal, vol. 24, No. 1, Mar. 1988, Kawasaki, Japan, pp. 47–52, S. Ohara et al., "Reproducible Nb/AlO$_x$/Nb Josephson Junctions".

Primary Examiner—Mahshid Saadat
Attorney, Agent, or Firm—Adams & Wilks

[57] ABSTRACT

A DC SQUID has a first washer coil for forming a superconducting ring, Josephson junctions and a dampening resistor coupled to both ends of the first washer coil, and a shunting resistor connected in parallel to the Josephson junctions. An input coil is magnetically coupled with the first washer coil, and a first modulation coil is also magnetically coupled with the first washer coil. A ground plane comprising a superconducting film is disposed to cover an area of the Josephson junctions without covering the first washer coil for shielding the Josephson junctions from a magnetic noise. The ground plane prevents a magnetic flux trap from occurring, thus enabling stable operation of the DC SQUID. A washer cover comprising a superconducting film is disposed to cover only a slit portion of the first washer coil to prevent leakage of a magnetic field from the slit portion. The ground plane and the washer cover are simultaneously formed in a same layer of the DC SQUID. A second washer coil can be connected in series, or in parallel, with the first washer coil for forming the superconducting ring. The second washer coil is effective for canceling a uniform magnetic flux, thereby improving the operation of the DC SQUID.

38 Claims, 5 Drawing Sheets

DC SUPERCONDUCTING QUANTUM INTERFERENCE DEVICE WITH SHIELD LAYER

This is a continuation of parent application Ser. No. 08/101,192 filed Aug. 3, 1993, now abandoned.

BACKGROUND OF THE INVENTION

The present invention relates to a DC superconducting quantum interference device ("DC SQUID"), which is applied to a highly sensitive magnetic sensor, an ammeter, a displacement meter, a high-frequency signal amplifier or the like.

The prior art DC SQUID, which is in a top plan view shown in FIG. 2, has a washer cover 8. Its operation is, however, unstable due to the lack of a ground plane, because interlinkage in an external magnetic flux often occurs, tending to invite a trap in the magnetic flux.

Because the trap of interlinkage in the magnetic flux is generated in the neighborhood of a Josephson junction 1, the operation of a conventional DC SQUID is unstable.

SUMMARY OF THE INVENTION

It is an object of the present invention to provide a DC SQUID with a stable operation.

In order to achieve the above-specified object, a ground plane of a superconducting layer is provided, in the manner that the ground plane is overlayed upon the area that contains a Josephson junction. In accordance with the present invention, the number of production process steps is not increased because this forming of the ground plane is simultaneously done in the same process step in which the washer cover of the washer coil is formed.

Since the DC SQUID having the inventive structure is superconductively shielded by the ground plane, in the neighborhood of the Josephson junction, the conventionally experienced interlinkage of external magnetic flux can be avoided, and thus a stable operation can be realized without the conventional problem of an external magnetic flux trap.

DETAILED DESCRIPTION OF THE PREFERRED EMBODIMENTS

The present invention will now be described with reference to the accompanying drawings.

Figure 1:
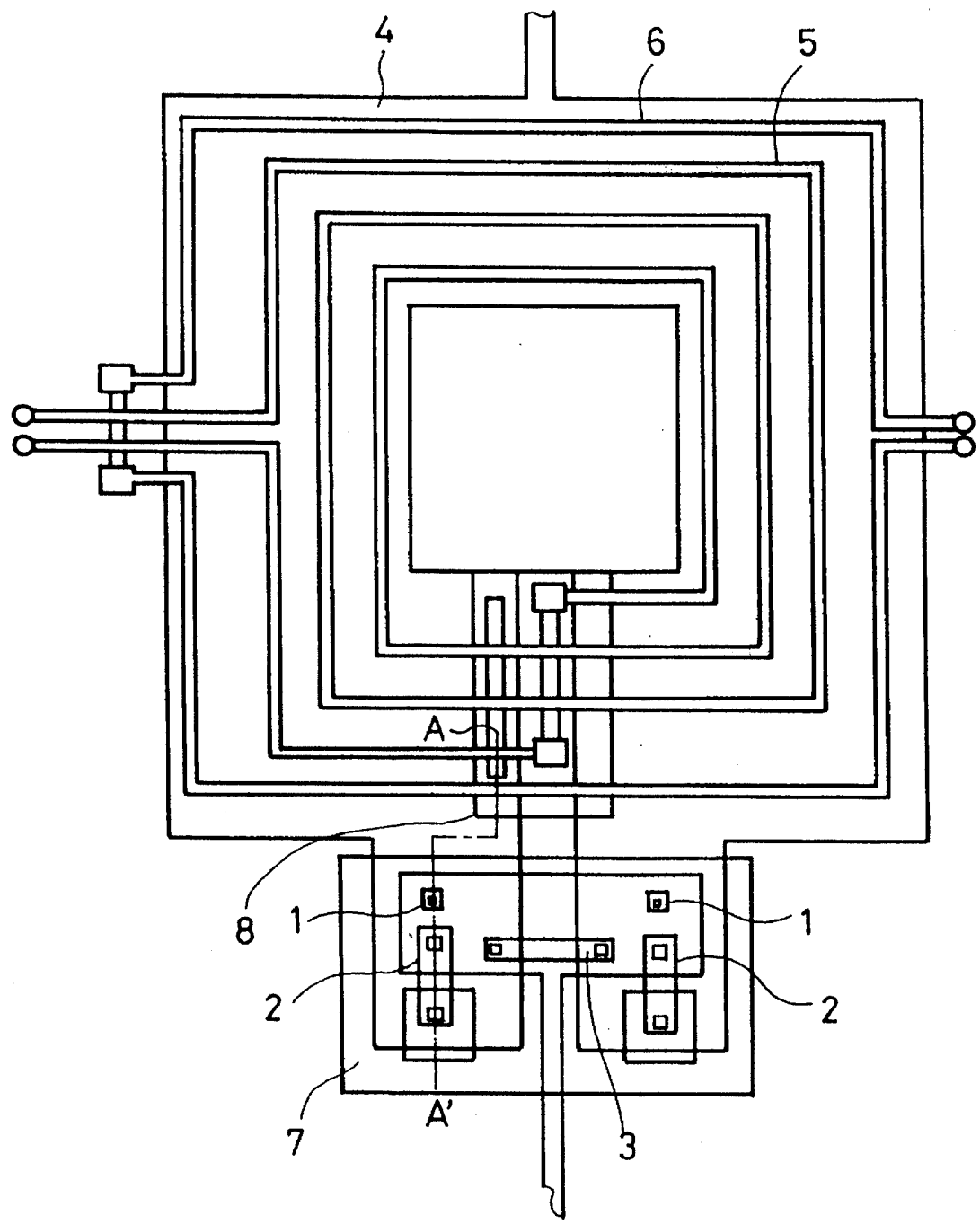
FIG. 1 is a top plan view showing a DC SQUID in accordance with the present invention.
Figure 2:
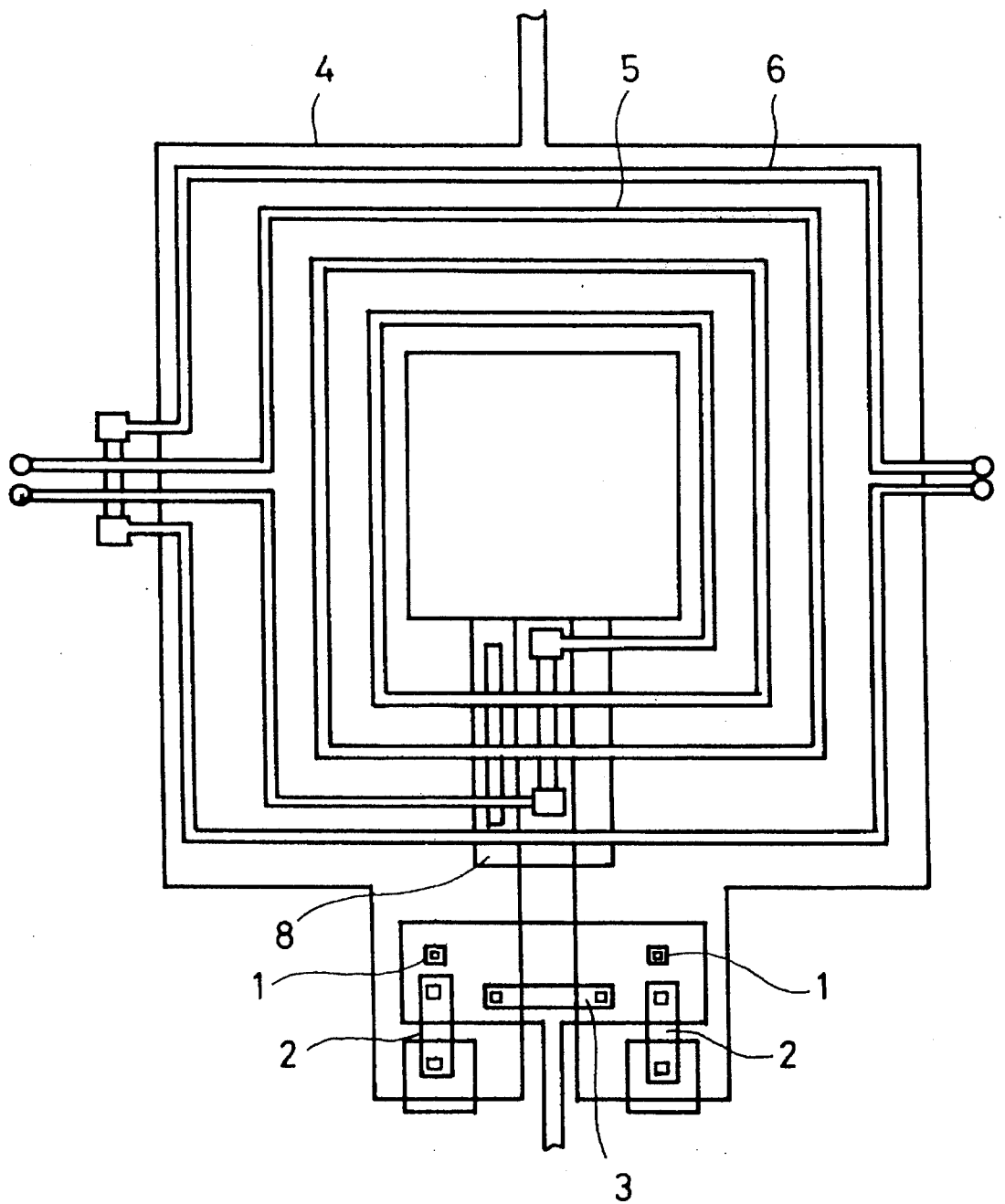
FIG. 2 is a top plan view showing the prior art DC SQUID.

FIG. 1 is a top plan view showing a DC SQUID in accordance with a first embodiment of the present invention.

In the DC SQUID, its operation becomes unstable in the manner that output signals flicker in its superconductivity state operation because magnetic flux becomes trapped or shifted. Such flicker becomes larger in effect, especially in the existence of trapping in the neighborhood of the Josephson junction 1. In accordance with the inventive DC SQUID structure, the ground plane 7, that is, the electrically insulated superconductive layer, broadly covers enough of the field containing the Josephson junction so that the traps of magnetic flux are not likely to be generated, and thus, making the operation of the inventive DC SQUID stable. In the production of the ground plane 7, the number of manufacturing steps for forming the DC SQUID is not increased, because the ground plane 7 can be simultaneously formed in the same process step in which is formed the washer cover 8, which is also a superconductive layer.

Figure 3:
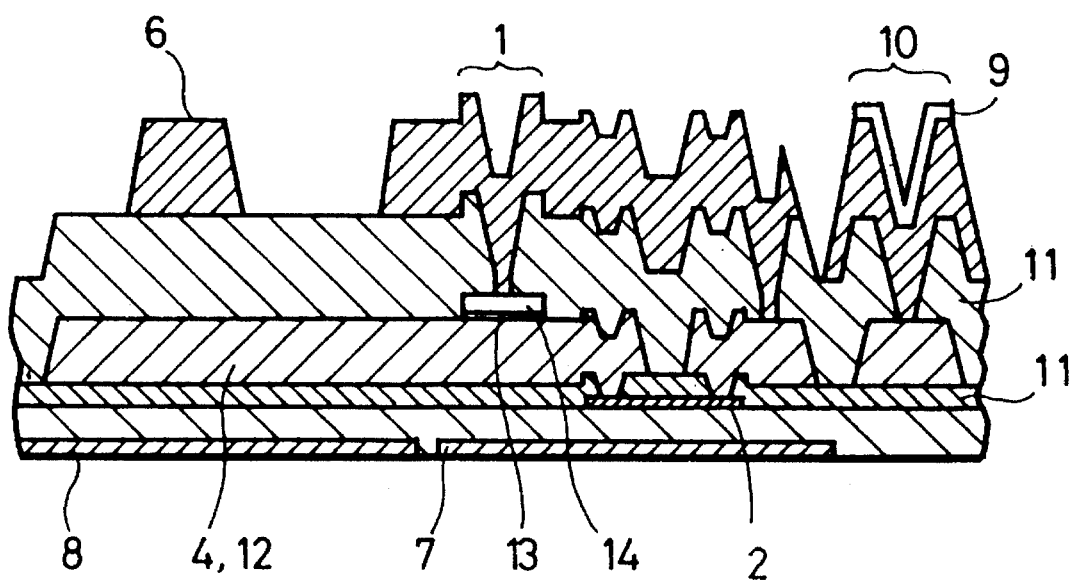
FIG. 3 is a sectional view showing a fabrication example of a DC SQUID in accordance with the present invention.

With reference to the accompanying drawing of FIG. 3, which shows a cross section of pads and is taken along line A—A' in FIG. 1, a manufacturing process in accordance with the present invention will be described. In accordance with the inventive method of manufacture, a patterning method for thin film photolithography should be applied. Thus, the ground plane 7 and the washer cover 8 are formed from a superconductive film, and insulated by an inter-layer insulating film 11. An example of a superconductive film is Nb deposited by DC magnetron sputtering. The superconductive film should be thick enough to realize superconductive shielding. Therefore, a film of about 100 nm or more of Nb should be formed. The ground plane 7 can be electrically grounded to the DC SQUID also.

Next, after resistance films of the shunting resistor 2 and the dampening resistor 3 in the DC SQUID are deposited, the resistor films are insulated by means of an inter-layer insulating film, and the value of resistance should be fixed to a designed level. The resistance film can be made of a metal such as Mo, MoN, Pd, Au, Cu, Al, Pd, Ti and such, any of which can be deposited by a sputtering or evaporation method.

Preferably, Al is deposited to a thickness of 100 nm by DC magnetron sputtering, and a pattern is formed to the designed size by photolithography. For the purpose of Al etching, both wet and dry etching methods can be used. An example of wet etching is a method using a mixture of mainly phosphoric acid and nitric acid. An example of dry etching is a method of a reactive ion etching (RIE) using a chloride gas such as $CCl_4$ or a mixture gas of the chloride gas. Preferably, the Al is etched by the wet etching method. The interlayer insulating film 11 can be made of $SiO_2$, SiO, Si, MgO and the like. Any of these materials can be deposited by the sputtering, evaporation or CVD process and so on. The deposited film is set to be 1.5 to 2 times as thick as the resistance film, so as to insulate the resistance film completely.

Preferably, after the $SiO_2$ is deposited to a thickness of 100 to 200 nm by an RF magnetron sputtering, the $SiO_2$ is etched to form contact holes to the resistance film by a photolithographic step. Both the wet and dry etching methods can be used for the etching of the $SiO_2$. The wet etching is exemplified by a method using a mixture of hydrofluoric acid. The dry etching is exemplified by a reactive ion etching (i.e., RIE) using a mixture of $CF_4$ or $CHF_3$, and oxygen. Here, the $SiO_2$ is etched by the RIE using the mixture of $CHF_3$ and oxygen.

The next step will be for forming a Josephson junction 1 comprising of lower electrode 12, barrier layer 13, and upper electrode 14, each of those should be deposited, after which the electrode 14 and the barrier layer 13 are etched by the photolithography. The Josephson junction 1 can be exemplified not only by the Nb/AlOx/Nb structure but also by a variety of structures of NbN/Mgo/NbN, Nb/Si/Nb,Nb/Nb - oxide/Nb and the like. Here, the Nb/AlOx/Nb structure is deposited by the sputtering process. Examples of the deposition here are as follows.

An Ar gas is introduced into a reaction chamber, which is evacuated to a high vacuum of $10^{-5}$ Pa or less. And the Nb film of the lower electrode 12 is deposited under a pressure of 0.1 to 4 Pa by the DC magnetron sputtering. The film is deposited to a set thickness of 100 to 300 nm. Then, the introduction of the argon gas is interrupted, and the reaction chamber is evacuated again to a high vacuum of $10^{-5}$ Pa or less. After this, the argon gas is introduced so that the Al is deposited to a thickness of 1 to 20 nm under a pressure of 0.1 to 4 Pa by the DC magnetron sputtering process. If the Al sputtering pressure is lower than that of the Nb sputtering pressure, the film becomes finer and its uniformity will be increased on the Nb surface.

No problem arises here, even though the evacuation to a high vacuum is not elaborately performed before the sputtering of the Al. The reaction chamber is evacuated to a high vacuum of $10^{-5}$ Pa or less, and an oxygen gas or a mixture gas of oxygen and argon is introduced to adjust the pressure to the set level. Then, the Al surface is oxidized to form the barrier layer 13 of AlOx/Al. The reaction chamber is evacuated to a high vacuum of $10^{-5}$ Pa or less, and the upper electrode 14 is deposited to a thickness of 100 to 300 nm under the aforementioned Nb depositing condition.

Next, the upper electrode 14 and the barrier layer 13 are etched by the photolithographic step to form the Josephson junction device 1. The etching method used is generally the dry etching method using a plasma. The Nb of the upper electrode 14 is subjected to the reactive ion etching (RIE) using $CF_4$ or a mixture gas of $CF_4$ and oxygen. The Al of the barrier layer 13 is removed by either the wet etching method using an acid or the RIE using an Ar gas. Here, the barrier layer 13 need not necessarily be etched.

Next, the washer coil 4 is formed by patterning the superconductive film deposited as the lower electrode 12 of the Josephson junction 1 by the photolithography process. The etching method used is generally the dry etching method using plasma. The Nb of the lower electrode 12 is subjected to the plasma etching or reactive ion etching (RIE) using a mixture gas of $CF_4$ and oxygen. Here, the etching is so different from that of the aforementioned upper electrode 14 that isotropic etching is effected by increasing the amount of oxygen resulting in the resist film in the peripheral of the pattern being etched with the oxygen into a tapered shape. The etching can be specifically exemplified by using the plasma etching apparatus with a gas, which is prepared by adding 10% of oxygen to the $CF_4$, under a pressure of 133 Pa and with a power of 50 W.

Next, after the inter-layer insulating film 11 is deposited, a contact hole is then formed by the photolithography process. A superconductive film is then deposited again to form a feedback modulation coil 6 and an input coil 5 by photolithography. The superconducting film is exemplified by the Nb, NbN, Pb-In or Pb-In-Au which is deposited by the sputtering or evaporation process.

Here, Nb film is deposited to 250–600 nm by DC magnetron sputtering, just as the Josephson junction electrode is formed. Before this deposition, the substrate should be reverse sputtered using Ar gas so as to make the substrate a superconductive contact. Next, the washer coil 4, counter electrodes and other wiring lines are formed by photolithography. The etching of the above is done by plasma etching as is performed in the forming of the aforementioned lower electrode 12.

If the detection coil which detects the external magnetic field is not formed simultaneously at the process step of the DC SQUID formation, it is necessary that the external detection coil should be superconductively connected to the DC SQUID during measuring. For this purpose, a buffer metal 9 may be necessary to be used for the superconductive contact on the pad 10. If a Pb-In alloy junction wire is used for the superconductive contact on the pad 10 comprised of Nb, Au is deposited to a thickness of 10–100 nm for the buffer metal 9 by sputtering. The patterning for the above can be done easily by wet etching using an acid and the like.

For the removal of the resist in photolithographic process, a wet or dry method can be applied. In the wet method, an organic solvent such as acetone and the like, alkaline detachment liquid, concentrated nitric acid, heated concentrated sulfuric acid, etc. is used. In the dry method, oxygen plasma or UV ray is used. Removal of the resist can also be done by a combination of both methods using one or more of the materials listed above.

The fabrication of the DC SQUID in accordance with the present invention can be done as mentioned above. The sequence of each layer forming can be interchangeable or converted, so long as the circuitry is not changed. Table 1 is a sample of design parameters for the fabrication of a DC SQUID having a shape as shown in FIG. 1, i.e. the first embodiment.

TABLE 1

| | |
|---|---|
| Washer hole size | 50 μm□ |
| Washer inductance | 79 pH |
| input coil inductance | 64 nH |
| input coil turn | 27 |
| feedback modulation coil turn | 1 |
| Josephson junction size | 5 μm□ |
| Josephson junction critical current | 16 μA |
| Shunting resistor | 4 Ω |
| Damping resistor | 2 Ω |

Figure 4:
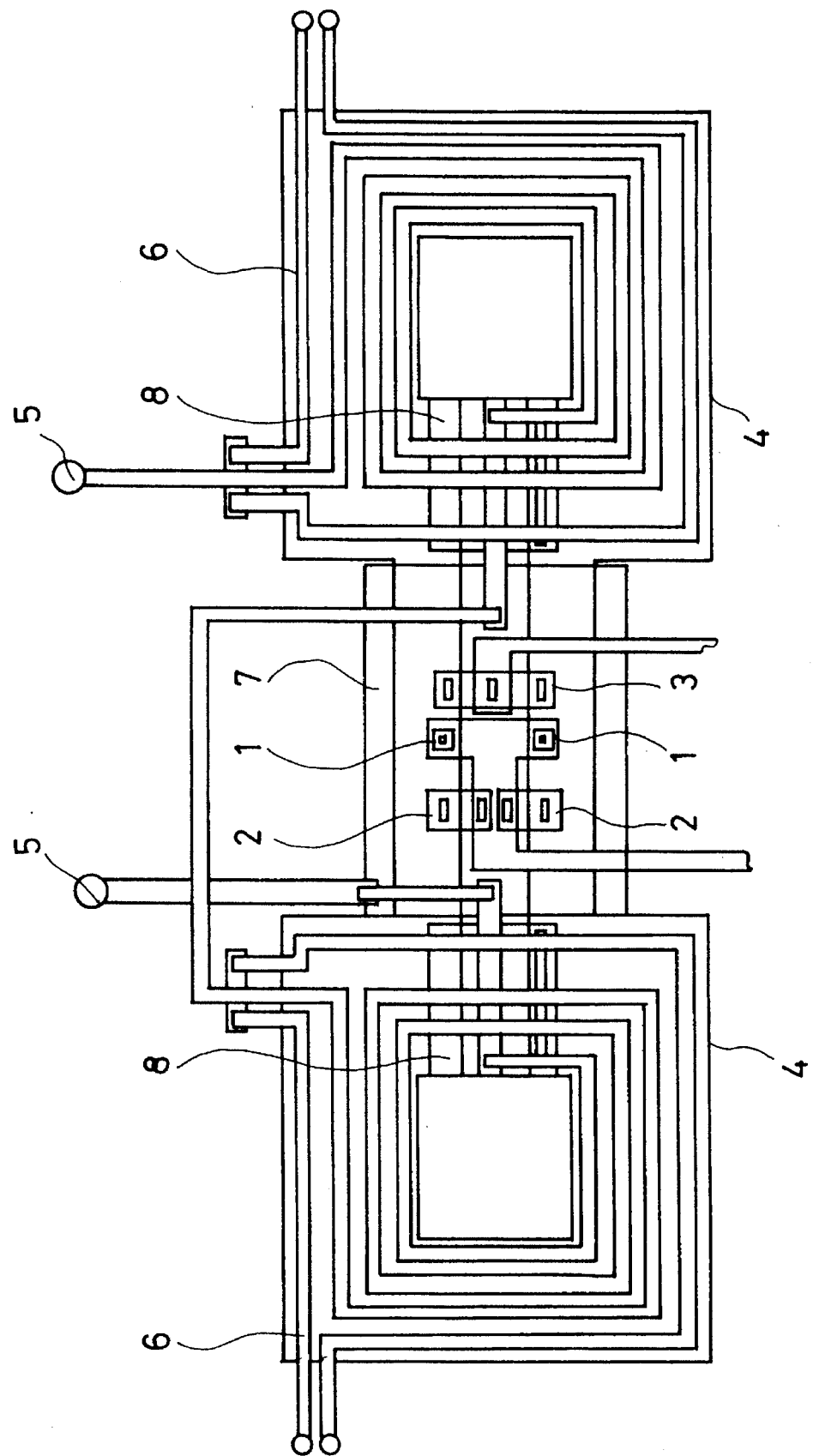
FIG. 4 is a top plan view of a DC SQUID in accordance with the present invention with double washer coils connected in parallel.
Figure 5:
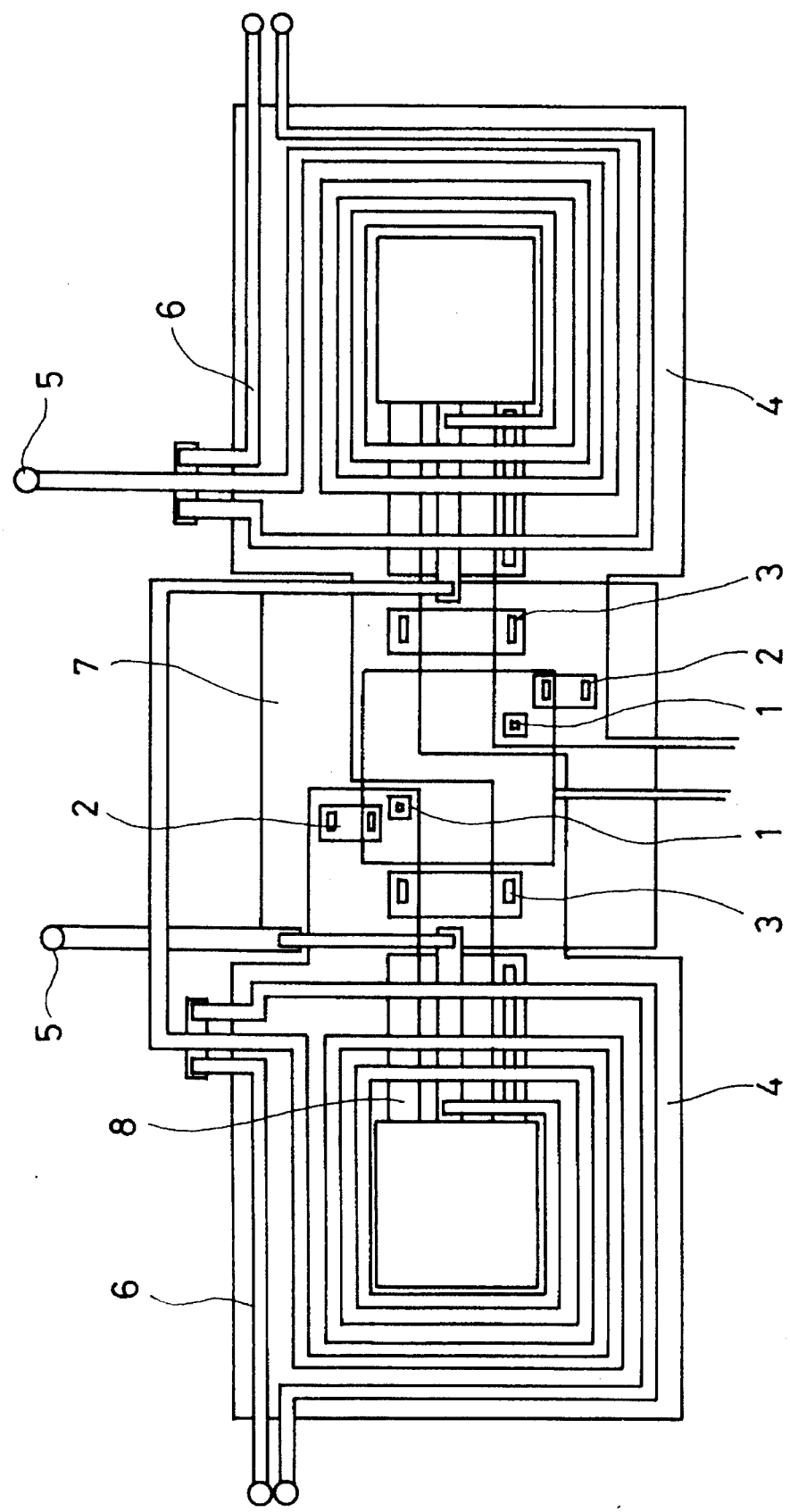
FIG. 5 is a top plan view of a DC SQUID in accordance with the present invention with double washer coils connected in series.

In the embodiment shown in FIG. 1, a single washer coil is shown. Multiple washer coil type DC SQUIDs having circuitry that is the same as that of the first embodiment, but having jointed multiple washer coils, can also be fabricated as shown in FIG. 4 or FIG. 5. That is, the second and the third embodiments of the invention are examples of double washer coil type DC SQUIDs having two washer coils.

In a DC SQUID with a single washer coil of FIG. 1, the first embodiment, the output signals tend to flicker, since the DC SQUID detects even a uniform magnetic field of flux linkage which the washer coil links to. Since DC SQUIDs with two washer coils can cancel out the uniform magnetic flux, the flicker of their output signals becomes smaller, and thus the operation of the DC SQUID becomes more stable.

Two ways of connecting of washer coils are possible, that is in parallel or in series. FIG. 4 is a sample of parallel connecting and FIG. 5 is an example of series connecting. Each double washer coil DC SQUID has two feedback modulation coils 6, and such SQUID can be utilized in many different ways. For feedback modulation purposes, either one coil or both coils can be used. Two coils may be used in such a way that one is for feedback purpose and another for modulation purpose. And another usage can be in that two coils are used only for modulation purpose, and in this case, a feedback function may be realized through the usage of a detection coil which works coupled not only for detection but also for feedback.

According to the present invention as hereinabove shown, a magnetic flux trap becomes hardly generated, the flicker of outputs owing to the magnetic flux trap can be reduced, and then stable operation of the DC SQUID can be realized, by setting up and overlaying the ground plane on the DC SQUID Josephson junction.

What is claimed is:

1. A low temperature DC superconducting quantum interference device comprising: a washer coil forming a superconducting ring; Josephson junctions coupled to both ends of the washer coil forming the superconducting ring; a shunting resistor connected in parallel to the Josephson junctions; a dampening resistor coupled to both ends of the washer coil; an input coil and a feedback modulation coil both magnetically coupled to the washer coil; a ground plane formed of a superconducting film and disposed to cover an area of the Josephson junctions without covering the washer coil for shielding the Josephson junctions from a magnetic noise without reducing the sensitivity of the device to an external magnetic field; and a washer cover formed of a superconducting film and disposed to cover only a slit portion of the washer coil to prevent leakage of a magnetic field from the slit portion; wherein the ground plane and the washer cover are formed in the same layer.

2. A low temperature DC superconducting quantum interference device according to claim 1; wherein the input coil is formed in a spiral shape upon the washer coil.

3. A low temperature DC superconducting quantum interference device comprising: a first washer coil forming a superconducting ring: Josephson junctions coupled to both ends of the first washer coil; a shunting resistor connected in parallel to the Josephson junctions; a dampening resistor coupled to both ends of the first washer coil; an input coil magnetically coupled to the first washer coil; a first modulation coil magnetically coupled to the first washer coil; and a ground plane comprising a superconducting film disposed to cover an area of the Josephson junctions without covering the first washer coil for shielding the Josephson junctions from a magnetic noise without reducing the device sensitivity.

4. A low temperature DC superconducting quantum interference device according to claim 3; further comprising a washer cover comprising a superconducting film disposed to cover only a slit portion of the first washer coil to prevent leakage of a magnetic field from the slit portion.

5. A low temperature DC superconducting quantum interference device according to claim 4; wherein the input coil is formed in a spiral shape on the first washer coil.

6. A low temperature DC superconducting quantum interference device according to claim 4; wherein the ground plane and the washer cover are simultaneously formed in the same layer of the DC superconducting quantum interference device.

7. A low temperature DC superconducting quantum interference device according to claim 6; further comprising a second washer coil connected in series with the first washer coil to form the superconducting ring and being effective to cancel a uniform magnetic flux.

8. A low temperature DC superconducting quantum interference device according to claim 7; further comprising a second modulation coil magnetically coupled with the second washer coil.

9. A low temperature DC superconducting quantum interference device according to claim 6; further comprising a second washer coil connected in parallel with the first washer coil to form the superconducting ring and being effective to cancel a uniform magnetic flux.

10. A low temperature DC superconducting quantum interference device according to claim 9; further comprising a second modulation coil magnetically coupled with the second washer coil.

11. A low temperature DC superconducting quantum interference device according to claim 4; further comprising a second washer coil connected in series with the first washer coil to form the superconducting ring and being effective to cancel a uniform magnetic flux.

12. A low temperature DC superconducting quantum interference device according to claim 11; further comprising a second modulation coil magnetically coupled with the second washer coil.

13. A low temperature DC superconducting quantum interference device according to claim 4; further comprising a second washer coil connected in parallel with the first washer coil to form the superconducting ring and being effective to cancel a uniform magnetic flux.

14. A low temperature DC superconducting quantum interference device according to claim 13; further comprising a second modulation coil magnetically coupled with the second washer coil.

15. A low temperature DC superconducting quantum interference device according to claim 3; further comprising a second washer coil connected in series with the first washer coil to from the superconducting ring and being effective to cancel a uniform magnetic flux.

16. A low temperature DC superconducting quantum interference device according to claim 15; further comprising a second modulation coil magnetically coupled with the second washer coil.

17. A low temperature DC superconducting quantum interference device according to claim 3; further comprising a second washer coil connected in parallel with the first washer coil to form the superconducting ring and being effective to cancel a uniform magnetic flux.

18. A low temperature DC superconducting quantum interference device according to claim 17; further comprising a second modulation coil magnetically coupled with the second washer coil.

19. A low temperature DC SQUID comprising: a first washer coil formed of a superconducting material; a circuit element having a Josephson junction coupled to the first washer coil; and a ground plane formed of a superconducting material disposed to cover at least a portion of the Josephson junction without covering the first washer coil for shielding the Josephson junction from magnetic noise substantially without reducing the sensitivity of the device to an external field.

20. A low temperature DC SQUID according to claim 19; further comprising a first washer cover formed of a superconducting material and disposed to cover only a slit portion of the first washer coil to prevent leakage of a magnetic field from the slit portion.

21. A low temperature DC SQUID according to claim 20; wherein the ground plane and the first washer cover are formed from a single film formed of a superconducting material.

22. A low temperature DC SQUID according to claim 21; further comprising an interlayer insulating film disposed between the single film and the first washer coil.

23. A low temperature DC SQUID according to claim 22; wherein the interlayer insulating film is also disposed between the ground plane and the Josephson junction.

24. A low temperature DC SQUID according to claim 21;

wherein the single film is formed by DC magnetron sputtering.

25. A low temperature DC SQUID according to claim 21; wherein the single film is formed of Nb.

26. A low temperature DC SQUID according to claim 25; wherein the thickness of the single film is approximately 100 nm.

27. A low temperature DC SQUID according to claim 25; wherein the thickness of the single film is adequate to achieve superconductive shielding.

28. A low temperature DC SQUID according to claim 19; further comprising a shunting resistor connected in parallel to the Josephson junction.

29. A low temperature DC SQUID according to claim 28; further comprising a dampening resistor coupled to the first washer coil.

30. A low temperature DC SQUID according to claim 29; wherein the shunting resistor and the dampening resistor are formed from a resistive film formed of at least one material selected from the group consisting of Mo, MoN, Pd, Au, Cu, Al, Pd and Ti.

31. A low temperature DC SQUID according to claim 30; wherein the resistive film is formed of aluminum deposited by DC magnetron sputtering and has a thickness of approximately 100 nm.

32. A low temperature DC SQUID according to claim 31; further comprising an interlayer insulating film disposed between the ground plane and the Josephson junction and having a film thickness approximately 1.5 to 2 times as thick as the resistive film.

33. A low temperature DC SQUID according to claim 19; further comprising an input coil and a feedback modulation coil both magnetically coupled to the first washer coil.

34. A low temperature DC SQUID according to claim 33; wherein the input coil is formed in a spiral shape upon the first washer coil.

35. A low temperature DC SQUID according to claim 19; further comprising a second washer coil connected in series with the first washer coil to form a superconducting ring and being effective to cancel a uniform magnetic flux.

36. A low temperature DC SQUID according to claim 35; further comprising a second modulation coil magnetically coupled with the second washer coil.

37. A low temperature DC SQUID according to claim 36; further comprising a second washer coil connected in parallel with the first washer coil to form a superconducting ring and being effective to cancel a uniform magnetic flux.

38. A low temperature DC SQUID according to claim 19; further comprising a second modulation coil magnetically coupled with the second washer coil.

* * * * *